United States Patent [19]

Quinlan

[11] Patent Number: 4,792,836
[45] Date of Patent: Dec. 20, 1988

[54] ION-SENSITIVE PHOTODETECTOR

[75] Inventor: Kenneth P. Quinlan, Newton, Mass.

[73] Assignee: The United States of America as represented by the Secretary of the Air Force, Washington, D.C.

[21] Appl. No.: 936,195

[22] Filed: Dec. 1, 1986

[51] Int. Cl.$^4$ .................... H01L 27/14; H01L 31/00; H01L 27/02

[52] U.S. Cl. ........................................ 357/30; 357/25; 357/23.1

[58] Field of Search ...................... 357/25, 30 I, 30 G, 357/23.1, 23.6, 40, 41, 24 LR

[56] References Cited

U.S. PATENT DOCUMENTS 3,873,215 3/1975 Quinlan .............................. 356/218
4,411,741 10/1983 Janata .................................. 357/25
4,488,556 12/1984 Ho ....................................... 357/25

OTHER PUBLICATIONS

"Gate-Controlled Diode for Ionic Concentration Measurement" from the IEEE Transactions on Electron Devices, vol. ed. 26, No. 12, Dec. 79, pp. 1945–1951.
"Proton Ejection Accompanying Light Induced Electron Transfer Between Chlorophyll and Hydroquinone" from Photochemistry and Photobiology 1967, vol. 6, pp. 665–667.
"Proton Ejection Accompanying Light-Induced Electron Transfer in the Chlorophyll-Quinone System" from the Journal of Physical Chemistry, vol. 71, No. 12, pp. 113–114.
"Light Induced Proton Ejection and Electron Transfer in the Zinc Tetraphenylporphin-Benzoquinone System" from the Journal of Physical Chemistry, vol. 72, No. 5, pp. 1797–1999.
"Proton Movement Accompanying the Light Induced Electron Transfer in the Chlorophyll-Quinone Systems" from the Photochemistry and Photobiology 1971, vol. 13, pp. 113–121.
"Ion-Sensitive Field-Effect Transistors with Inorganic Gate Oxide for pH Sensing" from IEEE Transactions on Electron Devices, vol. ED-29, No. 12, Dec. 1982, pp. 1936–1941.
"Ion-Sensitive Field Effect Transistors and Related Devices" from Analytical Chemistry, vol. 47, No. 2, Feb. 1975, pp. 255A–265A.
"Microelectronic Approaches to Solid State Ion Selective Electrodes" from Electrochimica Acta, vol. 22, pp. 1–8 (1975).
"ISFET's Using Inorganic Gate Thin Films" from IEEE Transactions on Electron Devices, vol. ED 26, No. 12, Dec. 1979, pp. 1938–1944.

Primary Examiner—James W. Davie
Assistant Examiner—Georgia Y. Epps
Attorney, Agent, or Firm—Stanton E. Collier; Donald J. Singer

[57] ABSTRACT

A photodetector using a modified ion-sensitive field effect transistor has therein a layer of photoactive material. Upon exposure to a beam of light the photoactive material produces a charge-separation (with proton movement) therein which affects the drain current. The change in gate voltage to stabilizes the drain current is a measure of the intensity of the light input.

1 Claim, 1 Drawing Sheet

ION-SENSITIVE PHOTODETECTOR

STATEMENT OF GOVERNMENT INTEREST

The invention described herein may be manufactured and used by or for the Government for gonernmental purposes without the payment of any royalty thereon.

BACKGROUND OF THE INVENTION

The present invention relates to photodetectors, and, in particular, relates to photodetectors that measure light intensity in a pre-selected range of wavelengths.

Previous photodetectors are of two basic types: semiconductor photodiodes and photomultiplier tubes. Photodiodes have an active material such as germanium, 0.8 to 1.8 microns; indium selenide, 1 to 5.5 microns; and mercury cadmium telluride, 2 to 22 microns. Each compound has a specific range of detection. Typical photomultipliers have a spectral response in the range of 0.3 to 0.8 microns. This range is determined by the photocathode materials and window materials. It is seen from these devices that frequency response is limited by fixed compound characteristics and device limitations such as window materials.

It would be desireable to have a photodetector which is able to detect a wide range of wavelengths by varying mixture ratios, etc.

SUMMARY OF THE INVENTION

The present invention sets forth an ion-sensitive photodetector that is able to detect a wide range of wavelengths and thereby overcomes the problems noted hereinabove.

In particular, the present invention includes a modified ion-sensitive field effect transistor having a photoactive layer of porphyrin and hydroquionone therein with a reference electrode (gate electrode) near the photoactive layer. The photoactive layer can either be a liquid or a solid solution. The detectable wavelength range is adjusted by changing the proportions of the two compounds therein. On exposure to light of the proper wavelength, a charge separation results in the photoactive layer. Charge separation is accompanied with proton ejection or proton up-take in various systems. This charge causes, in turn, a change in the operating characteristics of the device e.g. drain current. In particular, it is known that a given charge results from a given intensity of light and that this charge directly affects the gate voltage that maintains a constant drain current on the modified ion-sensitive field effect transistor (ISFET). Thus, the change in gate voltage indicates a light of a given intensity.

The ion-sensitive photodetector has a semiconductor substrate source and drain essentially like a typical field-effect transistor. The insulating layer between the gate and current channel is replaced with an ion-sensitive layer that does not conduct electrons therethrough but which has a fixed charge therein. Over the ion-sensitive layer, the photoactive layer is encapsulated with the gate electrode therein. A window over the photoactive layer allows the light to enter and interact with the photoactive layer.

In order to determine the intensity of the light, an electronic measuring circuit is employed that measures the change in the gate voltage when a constant voltage is applied to the drain. Two operational amplifiers are connected to the source. A feedback circuit in the second operational amplifier adjusts the gate voltage to maintain a constant drain current. The first operational amplifier converts the source current to a voltage for input into a voltage divider that is connected to the second operational amplifier.

It is therefore one object of the present invention to provide an ion-sensitive photodetector that can detect a broad range of wavelengths.

It is another object of the present invention to provide an ion-sensitive photodetector having a photoactive composition therein that may be selected based upon the wavelength to be detected.

It is another object of the present invention to provide an ion-sensitive photodetector that measures the light intensity as a function of the gate voltage on a modified ion-sensitive field-effect transistor.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
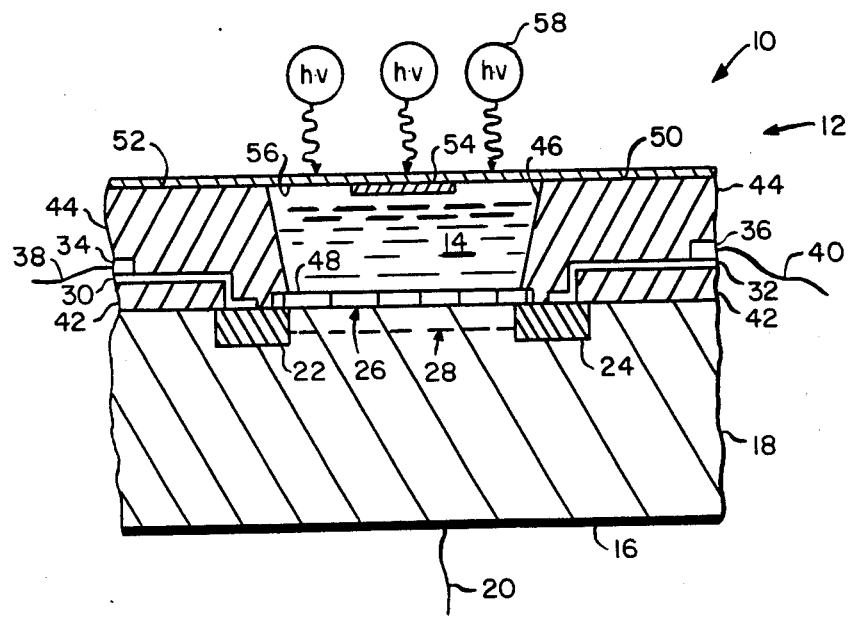
FIG. 1 illustrates by cross-section the modified ion-sensitive field effect transistor of the present invention.

Referring to FIG. 1, an ion-sensitive photodetector 10 is shown having a modified ion-sensitive field effect transistor 12 with a photoactive layer 14 therein.

As to the photoactive layer 14, layer 14 may be essentially a mixture of porphyrin and quinone. U.S. Pat. No. 3,873,215 is incorporated by reference as to the teachings contained therein especially those directed at the light sensitive compounds.

It has been found that certain light sensitive porphyrin-quinone solutions eject protons and uptake protons when illuminated. Charge-separation accompanies the movement of protons and is observed in light-sensitive solutions. The amount of uptake or ejection is proportional to the light intensity with a constant porphyrin concentration.The wavelength can be varied over a wide range which depends on the absorption characteristic of the porphyrin. When the light sensitive porphyrin-quinone solution is exposed to light, protons are ejected into the surrounding media. The photo-response of the photodetector 10 may also arise from a charge-transfer mechanism of layer 14.

Many porphyrins can be used as a component of the photoactive layer 14.Chlorophyll a, chlorophyll b, pheophytin, bacteriachlorophyll and zinc tetraphenylporphin have been found to be especially useful. Hydroquinone and benzoquinone have been found useful as the quinone component. Hydroquinone gives greater responses. With the use of benzoquinone, air can be present but air must be absent when using hydroquinone as the quinone component. The porphyrin concentration is usually in the range of about $10^{-2}$ to $10^{-5}$ moles while the quinone concentration is generally in the range of about $10^{-2}$ to $10^{-4}$ moles. The photoactive layer 14 need not be limited to porphyrins-quinone (hydroquinone) systems.

In FIG. 1, modified ion-sensitive field effect transistor 12 has therein a metal layer 16 attached to a p-type semiconductor substrate 18. A common lead 20 is attached to metal layer 16. A source 22 and a drain 24 of conventional FET design are placed in substrate 18. An ion-sensitive layer 26 being electrically non-conductive is placed over a channel path 28 between source 22 and drain 24.

A source current conductor 30 and a drain current conductor 32 are connected to the source 22 and the drain 24, respectively. Contacts 34 and 36 have leads 38 and 40, respectively, thereon for attaching leads. An electrically insulating layer 42 together with an insulating encapsulation layer 44 isolate electrically conductors 30 and 32 from substrate 18. Encapsulation layer 44 has a well 46 therein having a bottom 48 being the top surface of ion-sensitive layer 26. A window 50 is attached to the top 52 of layer 44 and totally enclose liquid photoactive layer 14 therein. Window 50 is transparent to light 58 of the desired wavelength. A gate electrode 54 is placed on the inside surface 56 of window 50.

The techniques of construction of photodetector 10 are considered conventional and known in the art of semiconductor integrated circuits. A description of ion-sensitive devices having field effect transistors therein is disclosed by R.G. Kelly in an article entitled "Microelectronic Approaches To Solid State Ion Selective Electrodes" in Electrochimica Acta. Vol. 22, 1977, pp 1 to 8.

Figure 2:
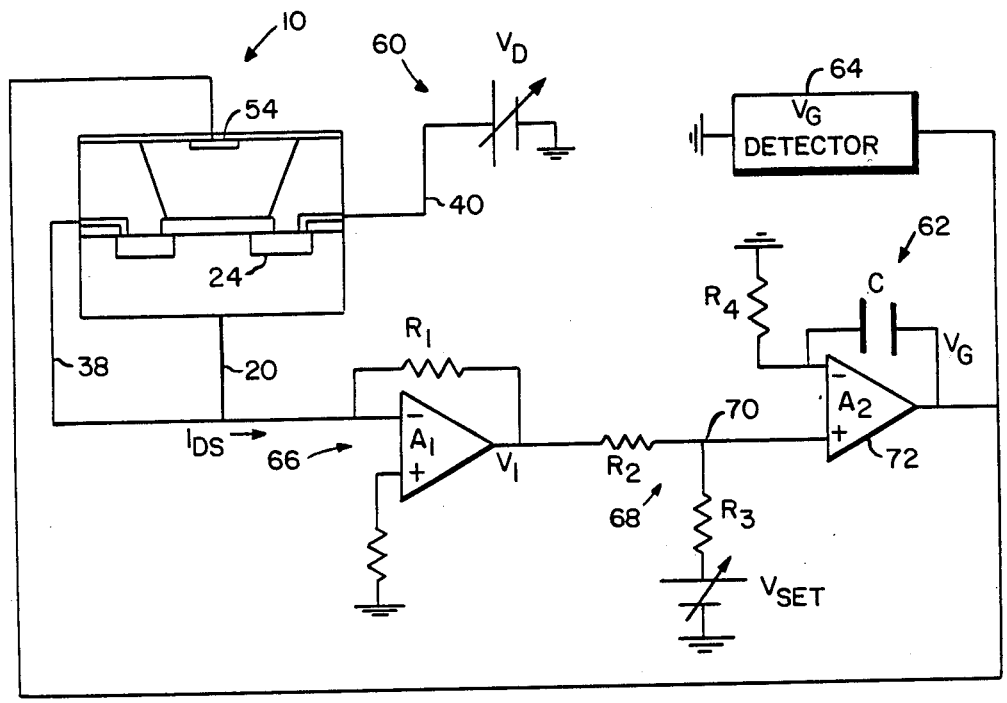
FIG. 2 illustrates the modified ISFET by cross-section and the gate voltage sensing circuit by schematic of the present invention.

FIG. 2 is a gate voltage sensing circuit 60 for the ion-sensitive photodetector 10. $I_{DS}$ is the current depending on proton concentration in photoactive system. In the dark a certain current, $I_{DS}$, will be observed. When the photoactive layer 14 is irradiated, protons are increased or decreased. This increased or decreased concentration will change $I_{DS}$. $I_{DS}$ is a function of proton concentration which in turn is a function of light intensity.

The wavelength sensitivity of the device is a function of the porphyrin used. Various porphyrins can be used whose absorption can vary from the visible to the infrared.

Various ion-sensitive materials e.g. $SiO_2$, $Al_2O_3$, $ZrO_2$, $Ta_2O_5$, etc. can be used in ion-sensitive layer 26.

The overall dimensions of ion-sensitive photodetector 10 is 5 mm long, 0.5 mm wide, and 0.30 mm thick. The photodetector 10 contains $7.5 \times 10^{-4}$ cc of the porphyrin-quinone (hydroquinone) photoactive system.

A reference electrode which can be defined as the gate electrode 54 can be used to increase the stability of the photodetector 10. The photodetector 10 uses a feedback circuit 62 to keep the drain current, $I_{DS}$, constant. A constant voltage, $V_D$, is applied to the drain. When the proton concentration is varied, the potential of the ion-sensitive layer 26 - photoactive layer interface changes. The potential at the interface changes the drain current. The drain current is maintained constant by varying the potential of the reference electrode (gate voltage, $V_G$). The changes in the reference electrode potentials compensate for the variation of the interface potential induced by protons. The amount of potential change of the gate electrode 54 is a function of the change of proton concentration induced by the absorption of light. The change in gate voltage observed is therefore a function of the light intensity and is detected by a detector 64.

The voltage, $V_D$ applied to the drain 24 is constant and the drain current, $I_{DS}$ is measured by an operational amplifier 66, $A_1$, which serves as a current to voltage converter. The output of operational amplifier 66, $V_1$, is fed into a voltage divider 68 where the other end is controlled by $V_{SET}$. The voltage at voltage terminal 70 of voltage divider 68 is the average of $V_1$ and $V_{SET}$ since $R_2$ and $R_3$ are equal. The average voltage is measured by an operational amplifier 72, $A_2$. The output of $A_2$ is fed to the reference electrode (gate electrode 54) and therefore regulates the drain current, $I_{DS}$. The negative of the operational amplifier 72, $A_2$, is grounded through $R_4$. Since the two inputs at operational amplifier 72, $A_2$, must be at the same voltage, the voltage on both inputs must be zero which requires that the output of operational amplifier 66, $A_1$, be $-V_{SET}$. Since the output of operational amplifier 66, $A_1$, is $R_1 I_D$, $I_D$ must be equal to $V_{SET}/R$. This requirement is met by the feedback operational amplifier 72, $A_2$, which adjusts its output, $V_G$, to control the drain current. Therefore, operational amplifier 72, $A_2$, holds the drain current constant by changing the voltage to the reference electrode (gate electrode 54). When the potential of the ion-sensitive layer 26 - photoactive media interface changes, the feedback circuit 62 compensates an equal and opposite change to maintain the drain current constant. The change in potential of the ion-sensitive layer-photosensitive media is a function of the amount of light-induced proton movement (with charge separation) in the photoactive layer 14. Since light intensity is proportional to the number of protons ejected or taken up, the light intensity can therefore be measured by the change in gate voltage, $V_G$, necessary to maintain a constant drain current.

Clearly, many modifications and variations of the present invention are possible in light of the above teachings and it is therfore understood, that within the inventive scope of the inventive concept, the invention may be practiced otherwise than specifically claimed.

What is claimed is:

1. A photodetector, said photodetector comprising:
   a planar substrate of a semiconductor material being doped;
   a metallic layer, said metallic layer being deposited upon a bottom surface of said substrate, said metallic layer having a common lead attached thereon;
   a source, said source being located within said substrate and having a surface coplanar with said substrate, said source being substantially rectangular shaped in cross-section, said source being doped opposite than said substrate;
   a drain, said drain being located within said substrate and opposite to said source and parallel thereto, said drain having a surface coplanar with said substrate, said drain being shaped substantially like said source, said drain being doped the same as said source;
   an ion-sensitive layer, said ion-sensitive layer being deposited on a top surface of said substrate and overlapping said source and said drain, said ion-sensitive layer being electrically non-conductive;
   a source current conductor connected to said source, said source current conductor having a source lead connected thereto;
   a drain current conductor connected to said drain, said drain current conductor having a drain lead connected thereto;
   an insulating layer deposited on said top surface of said substrate, said insulating layer overlapping said source, said drain, and said substrate, and having an opening therethrough, said conductors being deposited upon said insulating layer;

an encapsulating layer, said encapsulating layer having a well therethrough and having a bottom surface on said ion-sensitive layer, said encapsulating layer in contact with said insulating layer, said conductors, said source, and said drain;

a photoactive layer, said photoactive layer being placed within said well of said encapsulating layer, said photoactive layer being responsive to a band of wavelengths of light, a response being directly related to the intensity of said light;

a window, said window positioned over said well and in contact with a top surface of said encapsulating layer, said window sealing said photoactive layer within said well and allowing light to pass therethrough; and a gate electrode, said electrode being deposited on said window over said well and having a gate electrode lead attached thereto.

* * * * *